Figure 1:
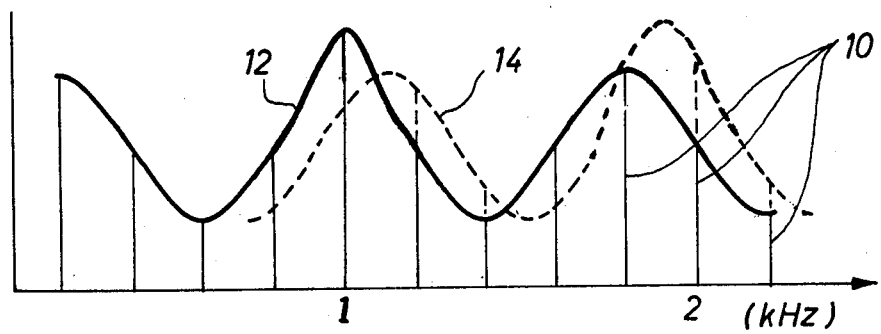

United States Patent [19]
Fricke et al.

[11] 4,101,840
[45] Jul. 18, 1978

[54] VOLUME CONTROL ARRANGEMENT FOR AN ELECTRO-ACOUSTIC SYSTEM

[75] Inventors: Jobst Fricke, Cologne; Helmut Reuter, Euskirchen, both of Fed. Rep. of Germany

[73] Assignee: CMB Colonia Management und Beratungsgesellschaft mbH & Co. KG, Cologne, Fed. Rep. of Germany

[21] Appl. No.: 691,639

[22] Filed: Jun. 1, 1976

[51] Int. Cl.² .......................... H03F 3/68; H03G 3/00
[52] U.S. Cl. ...................................... 330/127; 84/1.24; 84/1.27; 179/1 M; 179/1 VL; 330/126
[58] Field of Search ..................... 84/1.09, 1.1, 1.21, 84/1.24, 1.27; 179/1 M, 1 VL, 1 D; 330/126, 127

[56] References Cited
U.S. PATENT DOCUMENTS

| | | | |
|---|---|---|---|
| 2,235,249 | 3/1941 | Baxter | 179/1 D |
| 3,688,010 | 8/1972 | Freeman | 84/1.24 X |
| 3,719,782 | 3/1973 | Barnum | 179/1 M X |

*Primary Examiner*—Lawrence J. Dahl
*Attorney, Agent, or Firm*—Brisebois & Kruger

[57] ABSTRACT

A volume control arrangement for an electro-acoustic system, said arrangement having an adjustable amplification factor and a frequency characteristic dependent thereon, and comprising a frequency selective circuit which has an amplitude/frequency characteristic curve having at least one maximum lying within the audio frequency range and equivalent to the pass range of a band filter, and a circuit arrangement for varying the frequency and amplitude of the maximum in dependence on the adjustment of the amplification factor.

7 Claims, 2 Drawing Figures

VOLUME CONTROL ARRANGEMENT FOR AN ELECTRO-ACOUSTIC SYSTEM

The present invention relates to a volume control arrangement for an electro-acoustic system, for example a sound studio control console.

Volume control arrangements for broadcast apparatus usually contain means for aural fidelity volume control, whereby the volume-dependent sensitivity of the human ear for tones of different frequencies, such as is represented by the so-called auditory sensation surface is taken into account. In this way it is endeavoured to obtain an increasing bass emphasis or an attenuation of the high frequencies when the volume decreases.

Moreover it is desirable, with reproduction apparatus adjusted to low volume, to retain the balance between high and low frequencies as in the original recording. Lacking the facility for the aural fidelity volume control, the low frequencies would, in consequence of the physiologically determined shape of the acoustic curves, be too weakly perceptible.

A related but different problem occurs, for example, when making disc recordings of an orchestral work. In such a case the individual instruments or groups of instruments, soloists and so on are frequently recorded by means of separate microphones, and the individual component signals are mixed together by the sound engineer after suitable adjustment of the individual amplitudes. However, this is not achievable by using simple amplitude variation, because in the case of a conventional musical instrument, for example a string or wind instrument, the frequency content, in particular the positions and the intensity of the formants, varies with the volume (Schumann Displacement Law, see for example German Offenlegungsschrift 2,041,426).

For example, if the first violin is playing too softly, it is not possible, by increasing the amplitude of the relevant electrical signal, to generate the same sound impression as would be obtained if the corresponding passage had been played more loudly in the first place.

The present invention has for its main object the provision of a volume control arrangement by means of which it is possible to effect a suitable variation not only in the amplitude of a signal representing a sound but also in the tonal impression, so that, for example the volume and the tonal impression of a softly played instrument tone can be converted into the volume and the tonal impression of a more loudly played tone of the corresponding instrument.

According to the invention, there is provided a volume control arrangement, said arrangement having an amplification factor and a frequency characteristic dependent thereon, and comprising a frequency selective circuit which has an amplitude/frequency characteristic curve having at least one maximum lying within the audio frequency range and equivalent to the pass range of a band filter, and a circuit arrangement for varying the frequency of the maximum in dependence on the adjustment of the amplification factor.

By the adoption of the volume control arrangement according to the invention it is possible, in particular, to take the separately recorded instrumental sounds which are to be mixed together for final reproduction, and to bring these sounds into a desired volume relationship to each other as if the corresponding musical instruments had been played at the beginning with the correct respective volumes. Moreover, it is also possible to employ the volume control arrangement according to the invention in the recording disc reproduction of an orchestra, for example to emphasise the part of a particular instrument and a particular group of instruments, in which case the volume control arrangement will then contain a bandpass filter, which is tuned in a conventional manner to the formant regions containing the characteristic harmonics of the particular instrument (see, for example, German Offenlegungsschrift 2,041,429), but wherein, in accordance with the present invention, the position and intensity of this formant region is varied with volume adjustment. It is apparent that the formant emphasis according to German Offenlegungsschrift 2,041,429 can be performed at a desired position in the transmission chain between the recording of the original sound or sound mixture and the final reproduction operation, and the presently described volume control arrangement need not therefore always be employed in the reproduction section, but can be situated at a convenient position within the transmission chain.

Figure 2:
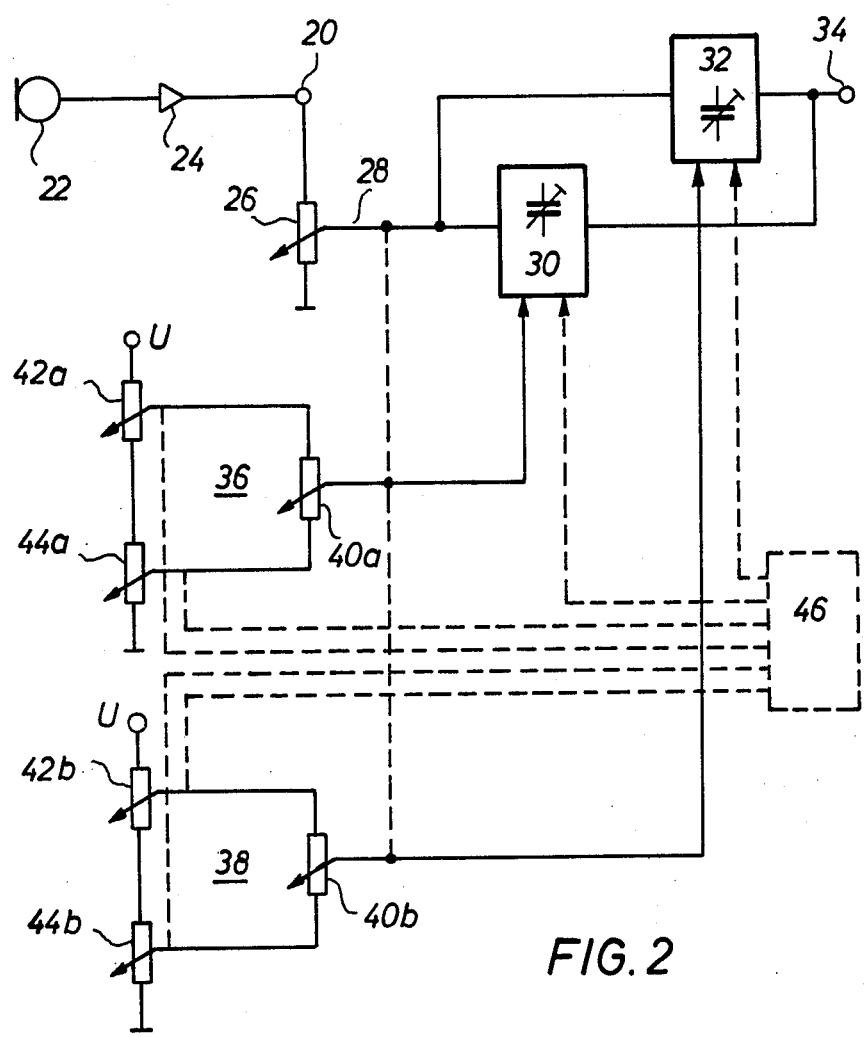

A practical example of the invention will now be further explained in the following with reference to the accompanying drawing, in which:

FIG. 1 is a graphic representation of the frequency distributions of two different volumes of a sound of given pitch played with a conventional musical instrument, for example a wind instrument; and FIG. 2 is a simplified circuit diagram of a volume control arrangement according to one practical example of the invention.

FIG. 1 shows a typical frequency spectrum of an instrumental sound, which is composed of harmonic component tones 10 distributed in the manner of lines of a spectrum, which have an amplitude distribution represented by an envelope curve 12, which determines the tonal character of the respective sound. The component tones 10 constitute formant regions or formants corresponding to the maxima of the envelope curve formed by the overtones of the fundamental tone, these being relatively independent of the pitch of the fundamental tone. However, the positions of the formant regions in the sound frequency spectrum depend to a certain degree upon the volume of the note which is played and, in fact, in such a manner that the formant regions displace themselves into the higher frequency regions and the higher formant becomes relatively stronger with increasing volume, as is represented in FIG. 1 by the envelope curve 14 shown in dashed lines. Thus the envelope curve 14 corresponds to a tone, which has the same pitch as the tone corresponding to the envelope curve 12, but which is played at a greater volume than the latter.

If, for example, in the production of a record disc of a string quartet, the individual instruments are recorded by individual microphones and, for example, the cello plays a certain passage too softly, then it is not sufficient simply to increase the amplitude of the signal from the "cello" microphone, but it is also necessary to vary the frequency response characteristic of this signal in order to obtain the impression of a more loudly played tone. The practical realisation of this apparently simple principle is, however, complicated by the fact that consideration of the variation of volume cannot start from an arbitrary frequency spectrum, but must start upon the basis of that particular frequency spectrum which corresponds to the volume which is actually played.

FIG. 2 shows the circuit diagram of a volume control arrangement, wherein this practical realisation may nevertheless be achieved with a relatively simple and inexpensive practical apparatus. The arrangement includes an input terminal 20, to which may be connected, for example, a microphone 22 for recording a selected instrument through a preamplifier 24. The input terminal 20 is connected to a volume control member in the form of a potentiometer 26, which may be, for example, of the linear type such as is conventionally used in sound mixing systems. The potentiometer 26 has a slider 28 provided with an adjusting knob (not shown) for the sound engineer, and is coupled to the inputs of two frequency-selective amplifiers 30 and 32. The amplifiers 30 and 32 have matching characteristics and may consist, for example, of Wien bridge amplifiers. As is well known, a Wien bridge amplifier contains a frequency determining RC member, whose resistance branch may consist, for example, of the channel of an insulated gate field effect transistor, whose resistance value is controllable by an electric control signal fed to the control electrode of the insulated gate field effect transistor. A coarse switching of the pass region can be effected by switching the capacitance of the RC member, as is indicated by the symbol for the adjustable capacitance in the block diagrams of the amplifiers 30 and 32.

The outputs of the amplifiers 30 and 32 are connected to the output terminal 34 of the volume control arrangement.

The signal for varying the frequency position of the pass range within the audio frequency region is generated, for each of the amplifiers 30 and 32, by means of an individual potentiometer arrangement 36 or 38 respectively. The frequency adjusting signal is a unidirectional voltage, the value of which can be varied within a definite voltage range corresponding to a predetermined frequency range, within which the pass region of the respective amplifier may be displaced as a whole.

The voltage range may be covered, in each case, by means of a potentiometer 40a and 40b and the limits of the voltage range can be varied independently by the aid of two series connected potentiometers 42a, 44a, and 42b, 44b respectively. By means of the potentiometers 42 and 44 it is therefore possible to adjust both the position as well as the magnitude of the respective voltage range, and thereby the position and magnitude of the frequency range, within which the pass band of the respective amplifier can be displaced.

If desired, the sliders of the potentiometers 26 and 40 can be coupled together so that once an adjustment has been effected a common displacement is possible.

Instead of using the potentiometers 42 and 44, which are shown connected between a voltage source U and earth, it is alternatively possible to use a switchable voltage divider and to simplify input procedures by means of a register (corresponding to an organ register). The register 46 shown purely schematically in the drawing may contain, for example, control levers for various instruments (violin, viola, cello . . . trumpet, trombone, oboe, bassoon etc.). By operation of particular levers, adjustment is effected for the corresponding formant character of the respective instrument, that is to say adjustment of the position and width of the envelope curve maxima and the displacement range of the formant regions. It is then only necessary, by adjustment of the potentiometer 26 with reference to the potentiometers 40 (which latter have been correctly adjusted with respect to each other by the register) to match the amplitude adjustment and the frequency characteristic curve of the volume control arrangement to the actual volume of the sound recorded by the microphone 22, whereafter the potentiometers 26 and 40 can then be adjusted in common if the volume characteristic of the electrical signal produced by the microphone is required to be varied.

The principle of the invention may also be put into practice in other ways than that which is above explained with reference to the practical example of FIG. 2. In many cases it will suffice to employ a single amplifier with a band pass filter characteristic, or it is possible to employ an amplifier whose frequency characteristic contains a plurality of maxima, such as may be realised, for example, with an amplifier having a suitable degree of coupling with a bandpass filter network. It is also possible to employ more than two frequency-selective amplifiers. The expression "amplification factor" is intended to be used in its widest sense and specifically is intended to include values which are smaller than one.

The single amplifier above mentioned having a bandpass filter characteristic is preferably so designed that it brings about a broad band high frequency accentuation in the region of about 1 to 6 KHz with a maximum at about 3 KHz.

We claim:

1. In an electro-acoustic system, a volume control arrangement having an adjustable amplification factor and a frequency characteristic dependent thereon and comprising:
    an input terminal for receiving an input audio signal characterised by at least one formant region defined by a maximum in the amplitude/frequency characteristic curve of the signal;
    a volume control in the form of a signal magnitude adjuster connected on one side to the input terminal;
    a frequency selective amplifier circuit having its input connected to the other side of the volume control and its output connected to an output terminal, said circuit including elements which define a pass range in the audio frequency region, the frequency position of said pass range being variable by adjustment of a control voltage applied to said elements; and
    means for generating said adjustable control voltage, said means including a device which is adjustable by operation of the volume control in such a manner that the output signal at the output terminal has a formant region the frequency position and amplitude of which is shifted, relative to the position and amplitude of the formant in the input signal, in response to adjustment of the volume control.

2. A volume control arrangement according to claim 1, wherein said frequency selective amplifier circuit is adapted by adjustment of the control voltage applied to said circuit elements automatically to raise the frequency position of the formant when the signal magnitude passed by the volume control is increased.

3. A volume control arrangement according to claim 1, wherein the amplifier circuit comprises at least two frequency selective amplifiers connected in parallel between said other side of the volume control and the output terminal, and the control voltage generating means includes respective control circuits for producing differing control voltages for adjusting the pass ranges of the respective amplifiers.

4. A volume control arrangement according to claim 1, wherein the control voltage generating means includes a register in the form of a switchable voltage divider, the said adjustable device being connected on the output side of said divider.

5. In an electro-acoustic system, a volume control arrangement having an adjustable amplification factor and a frequency characteristic dependent thereon and comprising:
   an input terminal for receiving an input audio signal characterised by formant regions defined by a plurality of maxima in the amplitude/frequency characteristic curve of the signal;
   a volume control in the form of a signal magnitude adjuster connected on one side to the input terminal;
   a frequency selective amplifier circuit having its input connected to the other side of the volume control and its output connected to an output terminal, said circuit comprising at least two frequency selective amplifiers each having associated control elements which define respective pass ranges in the audio-frequency region for the respective amplifiers, the frequency positions of said pass ranges being variable by adjustment of control voltages applied to said elements; and
   means for generating said adjustable control voltages, said means including a device which is adjustable by operation of the volume control in a manner to change the position, relative amplitude and Q factor of the formant maxima in the output signal at the output terminal as compared to the position, relative amplitude and Q factor of these maxima in the input signal.

6. A volume control arrangement according to claim 5, wherein the control voltage generating means includes a register in the form of a switchable voltage divider, the said adjustable device being connected on the output side of said divider.

7. In an electro-acoustic system, a volume control arrangement having an adjustable amplification factor and a frequency characteristic dependent thereon and comprising:
   an input terminal for receiving an input audio signal characterised by at least one formant region defined by a maximum in the amplitude/frequency characteristic curve of the signal;
   a volume control connected on one side to the input terminal, said volume control comprising a signal magnitude adjuster adjustable to variably attenuate the signal transmitted therethrough;
   a frequency selective amplifier circuit having its input connected to the other side of the volume control and its output connected to an output terminal, said circuit including elements which define a pass range in the audio frequency region, the frequency position of said pass range being variable by adjustment of a control voltage applied to said elements;
   means for generating said control voltage, said means including a device operable to adjust the control voltage applied to said elements in the frequency selective amplifier; and
   means for coupling said operable device in said control voltage generating means in predetermined relationship with said volume control, whereby said control voltage adjuster is operated simultaneously with said volume control in a manner to change both the amplitude and Q factor of the at least one formant maximum in the output signal at the output terminal as compared to the amplitude and Q factor of the at least one formant maximum in the input signal.

* * * * *